(12) United States Patent
Park et al.

(10) Patent No.: US 8,743,334 B2
(45) Date of Patent: Jun. 3, 2014

(54) DISPLAY SUBSTRATE, AND METHOD OF MANUFACTURING THE SAME

(75) Inventors: Jeong-Min Park, Seoul (KR); Jung-Soo Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 338 days.

(21) Appl. No.: 13/082,275

(22) Filed: Apr. 7, 2011

(65) Prior Publication Data

US 2011/0284853 A1 Nov. 24, 2011

(30) Foreign Application Priority Data

May 20, 2010 (KR) .................. 10-2010-0047437

(51) Int. Cl.
*G02F 1/1368* (2006.01)
(52) U.S. Cl.
USPC ........................................... 349/152
(58) Field of Classification Search
CPC . G02F 1/3452; G02F 1/1345; G02F 1/13458; G02F 1/136286
USPC ................ 257/59, E27.12, E33.004; 349/152
See application file for complete search history.

(56) References Cited

U.S. PATENT DOCUMENTS

| 7,208,764 B2 * | 4/2007 | Furusawa ..................... 257/72 |
| 2010/0314622 A1 * | 12/2010 | Kuo et al. ..................... 257/59 |

FOREIGN PATENT DOCUMENTS

| JP | 2005-342354 A | 12/2005 |
| KR | 1020010045441 A | 6/2001 |
| KR | 1020070054015 A | 5/2007 |
| KR | 1020080097304 A | 11/2008 |

* cited by examiner

*Primary Examiner* — Matthew W Such
*Assistant Examiner* — Monica D Harrison
(74) *Attorney, Agent, or Firm* — Innovation Counsel LLP

(57) ABSTRACT

A display substrate, a display device having the same and a method of manufacturing the display substrate are provided. The display substrate includes a base substrate having a pixels-populated area (PA) and a surrounding area (SA) outside the PA, a first contact pad portion formed in the surrounding area, a second contact pad portion formed in the surrounding area formed to be spaced apart from the first contact pad portion with a spacing region provided therebetween, an insulating layer formed in the spacing region between the first and second contact pad portions and having a thickness smaller than or equal to a thickness of each of the first and second contact pad portions, and a first conductive film formed on the first and second pad portions.

13 Claims, 15 Drawing Sheets

DISPLAY SUBSTRATE, AND METHOD OF MANUFACTURING THE SAME

CROSS-REFERENCE TO RELATED APPLICATION

This application claims priority from Korean Patent Application No. 10-2010-0047437 filed on May 20, 2010 in the Korean Intellectual Property Office, the disclosure of which application is incorporated herein by reference in its entirety.

BACKGROUND

1. Field of Disclosure

The present disclosure of invention relates to a display substrate, and a method of manufacturing the display substrate.

2. Description of Related Technology

Nowadays, due to progress in an information-oriented society, electronic display devices are becoming more important, and electronic display devices are widely used in various industrial and personal applications. In addition, and along with rapid progress of semiconductor technology, electronic display devices are tending towards increased integration, lower driving voltages, smaller power consumptions, slimmer profiles, and reduced weights. Accordingly, there exists an urgent need for yet further improved electronic display devices satisfying such tendencies, that is, flat panel display devices having advantages such as increased slimness, greater reduction of weight, lower driving voltages, small power consumptions, and the like.

SUMMARY

The present disclosure of invention provides a display device without a peel-off or lifting phenomenon occurring to a conductive layer formed in contact pad portions thereof.

The present disclosure also provides a method of manufacturing a display substrate without the lifting phenomenon occurring to the conductive layer formed in its contact pad portions.

The present disclosure also provides a display device without the lifting phenomenon occurring to the conductive layer formed in the contact pad portions thereof.

The above and other aspects of the present disclosure will be described in or be apparent from the following description of illustrated embodiments.

According to an aspect of the present disclosure, there is provided a display panel including a base substrate having a pixels-populated area (PA) and a surrounding area (SA) outside the PA, a first contact pad portion formed in the surrounding area, a second contact pad portion formed in the surrounding area to neighbor but be spaced apart from the first contact pad portion, an insulating layer formed in a spacing region between the first and second contact pad portions and having a thickness smaller than or equal to a thickness of each of the first and second pad portions, and a first conductive film formed on the first and second pad portions.

According to another aspect of the present disclosure, there is provided a method of manufacturing a display panel, the method including providing a base substrate having a pixels-populated area (PA) and a surrounding area (SA) defined therein; forming a first contact pad portion in the surrounding area and a second contact pad portion adjacent to the first pad portion; forming an insulating layer positioned in a spacing region between the first and second contact pad portions and having a thickness smaller than or equal to a thickness of each of the first and second pad portions; and forming a first conductive film on the first and second contact pad portions.

According to still another aspect of the present disclosure, there is provided a display device including a first display substrate, a second display substrate facing the first display substrate, and a liquid crystal layer positioned between the first and second display substrates, the first display substrate including a base substrate having a pixel area and a surrounding area defined therein, a first pad portion formed in the surrounding area, a second pad portion formed in the surrounding area formed adjacent to the first pad portion, an insulating layer formed between the first and second pad portions and having a thickness smaller than or equal to a thickness of each of the first and second pad portions, and a conductive film formed on the first and second contact pad portions.

BRIEF DESCRIPTION OF THE DRAWINGS

The above and other features and advantages of the present disclosure of invention will become more apparent by describing in detail illustrative embodiments thereof with reference to the attached drawings in which.

DETAILED DESCRIPTION

Advantages and features obtained from the present teachings and methods of accomplishing the same may be understood more readily by reference to the following detailed description of preferred embodiments and the accompanying drawings. The present teachings may, however, be embodied in many different forms and should not be construed as being limited to the exemplary embodiments set forth herein. Rather, these exemplary embodiments are provided so that this disclosure will be thorough and complete and will fully convey the concepts of the present teachings to those skilled in the pertinent art. Like reference numbers refer to like elements throughout.

Embodiments described herein will be described referring to plan views and/or cross-sectional views by way of ideal schematic views of the invention. Accordingly, the exemplary views may be modified depending on manufacturing technologies and/or tolerances. Therefore, the embodiments are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Hereinafter, a display substrate, a display device having the same and a method of manufacturing the display substrate will be described with reference to the accompanying drawings.

First, a display substrate according to a first embodiment in accordance with the present disclosure will be described with reference to FIGS. 1 through 4.

Figure 1:
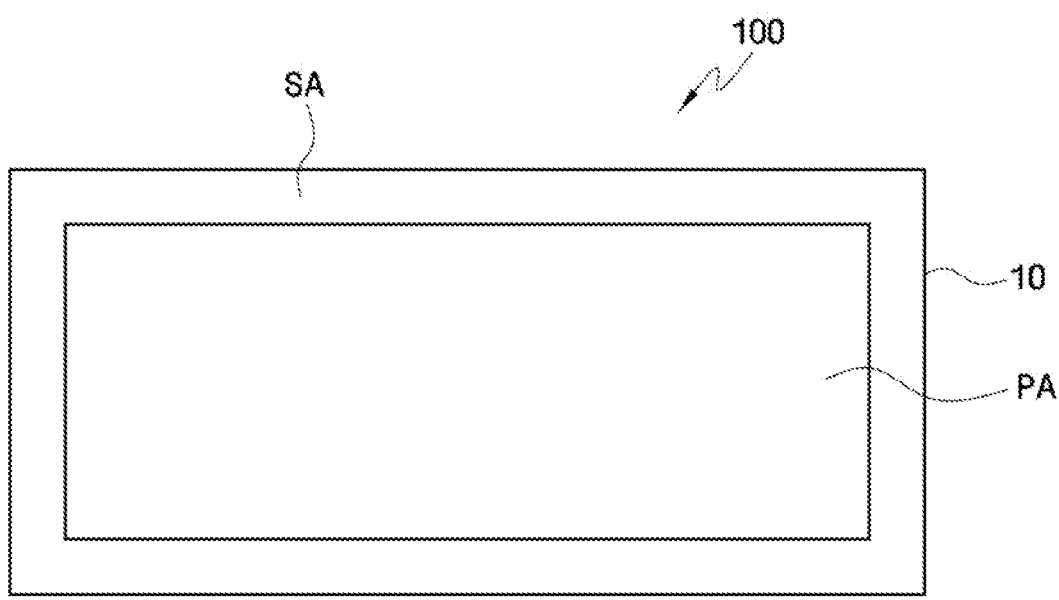
FIG. 1 illustrates a display device according to a first embodiment.
Figure 2:
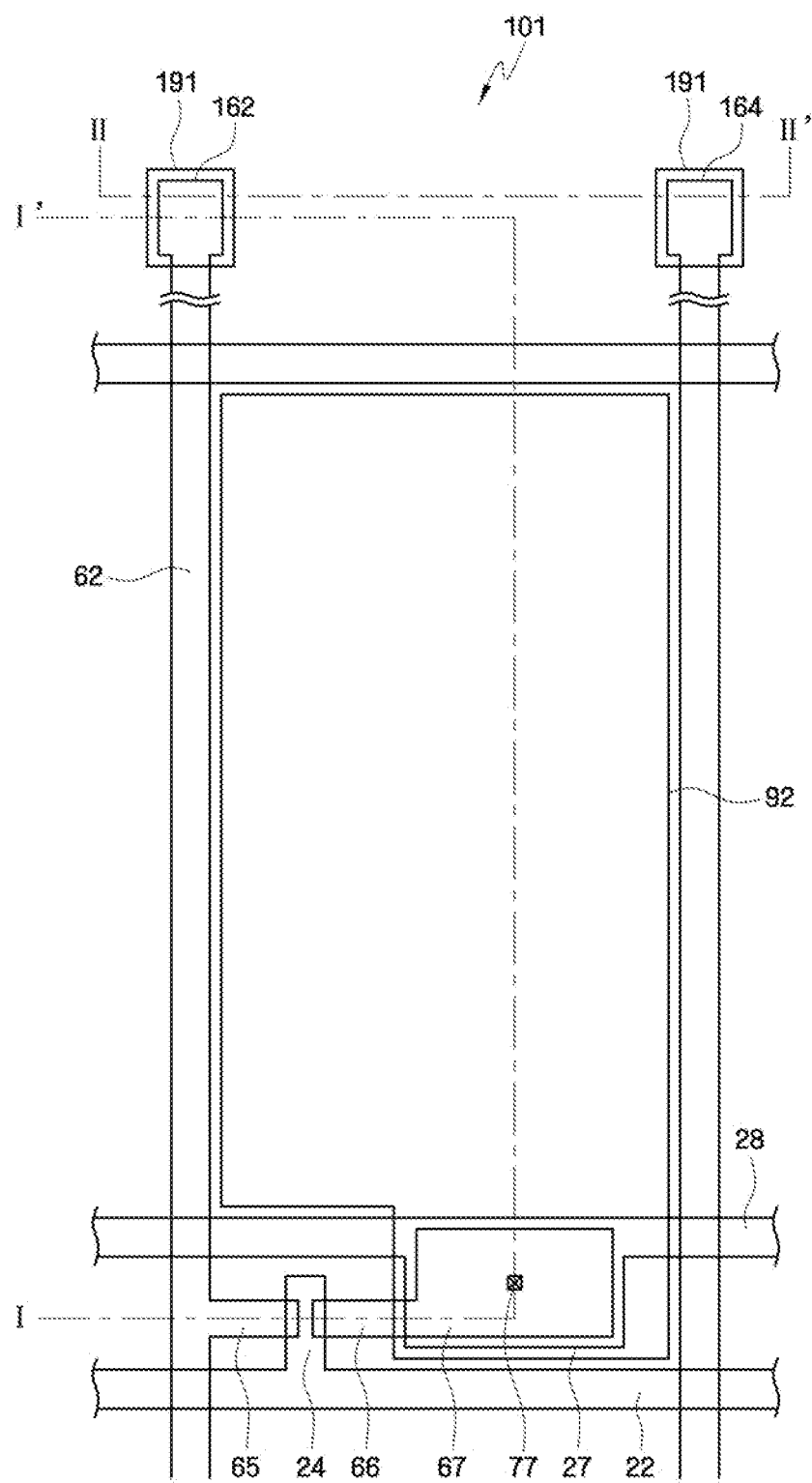
FIG. 2 is a plan view of a display panel portion of the device shown in FIG. 1.
Figure 3:
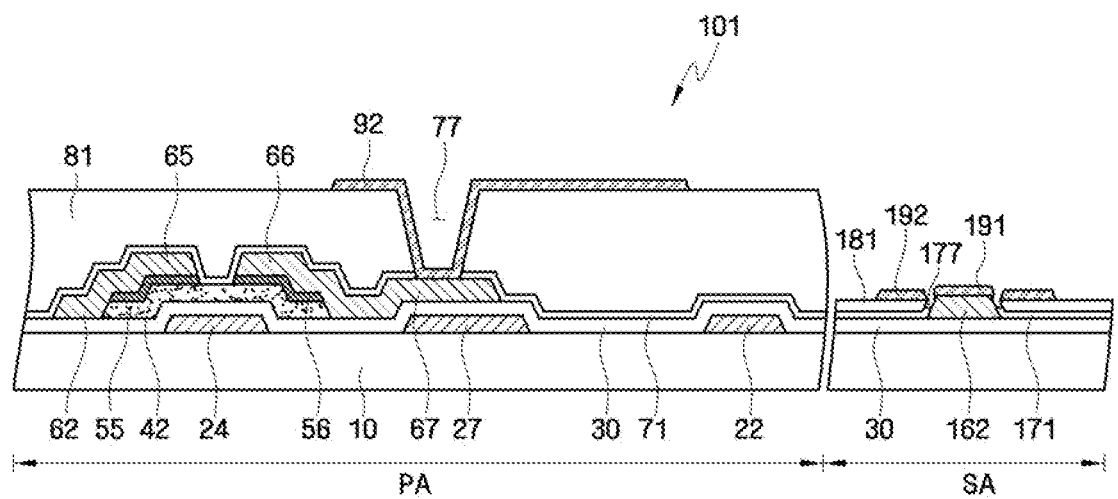
FIG. 3 is a sectional view, taken along line I-I' in FIG. 2.
Figure 4:
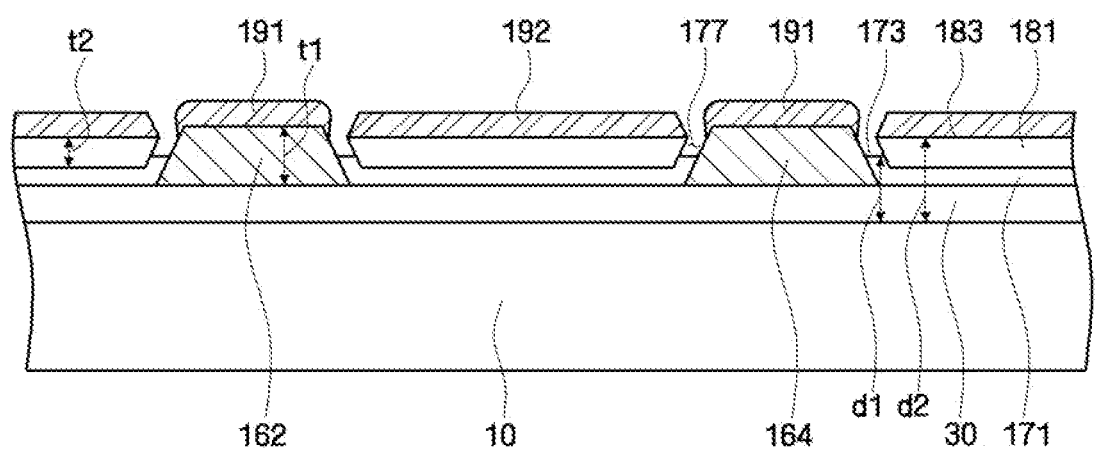
FIG. 4 is a sectional view, taken along line II-II' in FIG. 2.

FIG. 1 illustrates a plan view of display substrate according to a first embodiment, FIG. 2 is a plan view of an enlarged section the display substrate shown in FIG. 1, FIG. 3 is a sectional view, taken along line I-I' in FIG. 2, and FIG. 4 is a sectional view, taken along line II-II' in FIG. 2.

Referring to FIG. 1, a pixels-populated area PA (a.k.a. a display area or DA) of a display device 100 is wholly or partially surrounded by a non-displaying surrounding area SA (a.k.a. a peripheral area) of the pixels-populated area PA. The pixels-populated area PA and surrounding area SA are integrally and monolithically defined on a base substrate 10 (see also FIGS. 3-4) where the base substrate 10 is included as a foundational part of a monolithically integrated display substrate 101 (a.k.a. TFT array substrate) formed according to the first embodiment of the present teachings.

A plurality of substantially alike pixel units are arranged in the pixels-populated area PA, typically in a matrix form. Each of the pixel units in the pixels-populated area PA is structured to receive an image-defining electrical signal and to responsively produce a corresponding optical state in correlation with supplied predetermined pixel information signals. Accordingly, an image is displayed in the pixels-populated area PA. The surrounding area SA is an area of the base substrate 10 outside the pixels-populated area PA. The surrounding area SA is typically disposed at a peripheral area portion of the base substrate 10 so as to fully or partially surround the pixels-populated area PA. A plurality of electrical contact pad portions may be disposed in the surrounding area SA in order to contact-wise convey electrical signals to (and/or from) the pixel units arranged in the pixels-populated area PA. The plurality of contact or connection pad portions may be electrically connected to packaging terminals (e.g., grid bumps) of matched integrated circuit driver chips (not shown) or to a matched printed circuit board (PCB, not shown) so as to conduct electrical signals between the connected driver chips (IC's) and/or PCB's and the pixel units of the pixels-populated area PA by way of the plurality of pad portions.

Referring to FIGS. 2 through 4, the display substrate 101 according to the first embodiment includes a plurality of thin film transistors (TFTs) formed in the pixels-populated area PA thereof, and first and second pad portions 162 and 164 formed in the surrounding area SA thereof. For the sake of convenient explanation, in the following description, a century offset is used so that, for example, a passivation film formed in the pixels-populated area PA is denoted by the 1st century reference numeral 71 and an extension of the passivation film as formed in the surrounding area SA is denoted by the counterpart 2nd century reference numeral 171, respectively. As an additional example, an insulating layer formed in the pixels-populated area PA is denoted by reference numeral 81 and while the SA counterpart of the same insulating layer as formed in the surrounding area SA is denoted by reference numeral 181.

First, details of a thin film transistor formed in the pixels-populated area PA will be described.

The base substrate 10 may be made of a transparent electrical insulator such as glass (e.g., a soda lime glass) or a borosilicate, a plastic, or the like.

Gate wirings (22, 24) that deliver gate signals to corresponding gate portions of the TFTs (only one shown in FIG. 2) are directly deposited on the base substrate 10 in one embodiment. The gate wirings (22, 24) include a gate line 22 that extends in one direction, for example, in a horizontal direction, and a gate electrode 24 of a TFT, that integrally protrudes from the gate line 22 to overlap a channel portion of the transistor (the TFT).

In addition, storage wirings (27, 28) are simultaneously formed directly on the base substrate 10 in the one embodiment to deliver a common voltage to corresponding plates of formed storage capacitors. The storage wirings (27, 28) include a storage electrode 27 and a storage line 28. The storage line 28 extends in a horizontal direction to be substantially parallel to the gate line 22. The storage electrode 27 may be formed to have a larger width than the storage line 28. The storage electrode 27 overlaps a drain electrode contact pad 67 of the TFT. The drain electrode contact pad 67 provides connection through a through-hole to a pixel electrode 92 of the pixel unit as will be described later. The spaced apart storage electrode 27 and drain electrode contact pad 67 operate to form corresponding plates of a storage capacitor, where the latter enhances a charge storage capability of the pixel unit. The storage wirings (27, 28) may have various shapes and may be disposed at various locations other than those of the illustrative first elongated. If sufficient storage capacitance is generated by the overlapping of a pixel electrode portion 92 of the pixel unit and the gate line 22, the storage wiring (27, 28) may be omitted.

Each of the gate wirings (22, 24) and the storage wirings (27, 28) may be made of an aluminum (Al)-based metal such as Al or an Al alloy, of a silver (Ag)-based metal such as Ag or Ag alloys, of a copper (Cu)-based metal such as Cu or Cu alloys, of a molybdenum (Mo)-based metal such as Mo or Mo alloys, of a manganese (Mn)-based metal such as Mn or Mn alloys, of a chrome (Cr), titanium (Ti), or tantalum (Ta). In addition, each of the gate wirings (22, 24), the storage electrode 27 and the storage line 28 may have a multi-layer structure composed of two conductive layers (not shown) with different physical characteristics. In this case, one of the two conductive layers may be made of metal with low resistivity, such as Al-based metal, Ag-based metal or Cu-based metal, in order to reduce signal delays or voltage drops of the gate wiring (22, 24), the storage electrode 27 and the storage line 28. On the other hand, the other one of the conductive layers of the multi-layer interconnect structure may be made of a different material, in particular, a material having superior contact characteristics with later to be deposited thereon materials such as zinc oxide (ZnO), indium tin oxide ("ITO") and indium zinc oxide ("IZO"), or such as Mo-based metal, Cr, Ti, or Ta. Good examples of the multi-layer structure may include a combination of a Cr lower layer and an Al upper layer, a combination of an Al lower layer and a Mo upper layer, a combination of a CuMn alloy lower layer and a Cu upper layer, or a combination of a Ti lower layer and a Cu upper layer. However, the present disclosure of invention is not limited thereto. Each of the gate wiring (22, 24) and the storage wiring (27, 28) may be made of various other metals and/or alternate electrical conductors.

A gate insulating layer 30 made of, e.g., an inorganic insulating material such as a silicon oxide ($SiO_x$) or a silicon nitride ($SiN_x$), or a silicon oxynitride ($SiO_xN_y$), or an organic insulating material such as benzocyclobutene (BCB), acryl-based materials or polyimide is disposed on the gate wirings (22, 24), the storage wirings (27, 28), and portions of the base substrate 10 which exclude the gate wiring (22, 24) and the storage wiring (27, 28). The gate insulating layer 30 covers the gate wiring (22, 24) and the storage wiring (27, 28).

A semiconductive layer 42 is formed on the gate insulating layer 30 to overlap with the gate electrode 24. The semiconductive layer 42 may be made of appropriately doped amorphous silicon (to be briefly referred to as a-Si).

In addition or alternatively, the semiconductive layer 42 may be made of a semiconductive oxide including at least one of gallium (Ga)), zinc (Zn), indium (In), and tin (Sn). The semiconductive oxide may further include an element such as tantalum (Ta) or hafnium (Hf). The semiconductive oxide may include, but not limited to, a compound such as GaInZnO, HfInZnO, TaInSnO, HfZnSnO, InZnO, InSnO, or ZnSnO. The semiconductive oxide may have an amorphous phase, a combination phase of crystalline and amorphous phases, or a crystalline phase.

Ohmic contact layers 55 and 56 are formed on the semiconductive layer 42. The ohmic contact layers 55 and 56 may improve a contact characteristic between source/drain electrodes 65 and 66 to be described later and the semiconductive layer 42. Here, the ohmic contact layers 55 and 56 may be made of a metal oxide or n+ amorphous silicon (to be referred to as n+a-Si) which is doped with n-type impurities in a high concentration. If the contact characteristic between source/drain electrodes 65 and 66 and the semiconductive layer 42 is sufficiently high, the ohmic contact layers 55 and 56 may be omitted.

Data wirings (62, 65, 66, 67) are formed on the ohmic contact layers 55 and 56 and the gate insulating layer 30. The data wirings (62, 65, 66, 67) include a data line 62 that extends in a vertical direction and insulatively crosses with the gate line 22 so as to define within areas bounded by adjacent gate lines and data lines, corresponding pixel areas. (A pixel unit may be understood to include the various function structures within its pixel area including the corresponding TFT and pixel-electrode (92).) The data wirings (62, 65, 66, 67) further include a source electrode 65 integrally branched off from a respective data line 62 and extending toward an upper portion of the semiconductive layer 42, a drain electrode 64 separated from the source electrode 65 and formed over the semiconductive layer 42 so as to overlap with the gate electrode 24 and channel region of the corresponding TFT. The drain electrode 64 is spaced apart from and faces the source electrode 65 so that the channel region is interposed there between. A drain electrode contact pad 67 extends integrally from the drain electrode 66 and overlaps the storage electrode 27.

The data wirings (62, 65, 66, 67) may directly contact the semiconductive layer 42 or connected to it by way of the ohmic contact layers 55 and 56. In order to form ohmic contacts to the semiconductive layer 42, the data wirings (62, 65, 66, 67) may have a single layered structure made of for example Ni, Co, Ti, Ag, Cu, Mo, Al, Be, Nb, Au, Fe, Se, Mn or Ta or they may have a multi-layer structure composed of layered combinations of these materials. Examples of the multi-layer structure may include a double-layer structure composed of a combination of Ta/Al, Ta/Al, Ni/Al, Co/Al, Mo (Mo alloy)/Cu, Mo (Mo alloy)/Cu, Ti (Ti alloy)/Cu, TiN (TiN alloy)/Cu, Ta (Ta alloy)/Cu, TiOx/Cu, Al/Nd, Mo/Nb, or Mn (Mn alloy)/Cu layers, or a triple-layer structure composed of a combination of Ti/Al/Ti, Ta/Al/Ta, Ti/Al/TiN, Ta/Al/TaN, Ni/Al/Ni, or Co/Al/Co layers. However, the present disclosure does not limit the data wirings (62, 65, 66, 67) to the materials and layered structures listed herein.

Passivation film sections 71 and 171 are formed on the data wirings (62, 65, 66, 67) and on the semiconductive layer 42. The in-pixels-area passivation film section 71 may protect the channel region of each TFT and may be formed by using low-temperature chemical vapor deposition ("LTCVD") or a sputtered film in order to provide protection from a photoresist pattern which will be described later. The first passivation film 71 may be made of, for example, an inorganic material such as a silicon nitride (SiNx), a silicon oxide (SiOx), or a silicon oxynitride ($SiO_xN_y$). The first passivation film 71 may be made of, by way of other example, a material with low resistivity, such as a-Si:C:O or a-Si:O:F obtained by plasma enhanced chemical vapor deposition (PECVD), but not limited thereto.

An insulating layer 81 is formed on the passivation film 71. The insulating layer 81 may be made of an organic material with excellent planarization properties and photosensitivity. That is to say, the insulating layers 81 and 181 may be made of positive-type or negative-type photoresist (PR), but not limited thereto.

A drain contact hole 77 is formed through the passivation films 71 and through the insulating layer 81. The drain electrode pad 67 is exposed through the drain contact hole 77.

The pixel electrode 92 is formed on the insulating layer 81, conforming to the shape of the underlying rest of the pixel unit. The pixel electrode 92 is electrically connected to the drain electrode pad 67 through the contact hole 77. The pixel electrode 92 may include a transparent conductive material such as ITO or IZO or a reflective conductive material such as aluminum (Al) or sectioned off areas of both (so as to form a combination partially transmissive and partially reflective pixel-electrode if desired).

Next, contact pad portions formed in the surrounding area SA will be described.

The gate insulating layer 30 is also formed in the surrounding area SA of the base substrate 10. The gate insulating layer 30 formed in the surrounding area SA is the same as the gate insulating layer 30 formed in the pixels-populated area PA. In addition, the gate insulating layer 30 formed in the surrounding area SA integrally extends from and as part of the gate insulating layer 30 formed in the pixels-populated area PA.

Referring to FIG. 4, a first contact pad portion 162 and a second contact pad portion 164 neighboring but spaced apart from the first contact pad portion 162 are formed on the gate insulating layer 30 in the surrounding area SA. The first and second contact pad portions 162 and 164 may be made of the same material(s) and have same layered structuring as the data wirings (62, 65, 66, 67). The data line 62 may extend integrally from the first and second contact pad portions 162 and 164. That is to say, the first and second pad portions 162 and 164 may be electrically and physically connected to the data line 62. Accordingly, when respective external electrical signals are applied respectively to the first and second contact pad portions 162 and 164, the external electrical signals may be transmitted to corresponding source electrodes 65 of each respective pixel unit through the corresponding data lines 62, 62' electrically connected to the respective first and second contact pad portions 162 and 164.

The passivation film portion 171 of the surrounding area SA is formed to abut against portions of inclined sidewalls of the first and second pad portions 162 and 164. The passivation film portion 171 is further disposed in one embodiment, directly on the gate insulating layer 30. More specifically, here, the passivation film 171 is formed to a thickness less than that (t1) of the first and second contact pad portions 162 and 164 and extended only partially along the inclined sidewalls of the contact pad portions 162 and 164 so that the passivation film 171 is thereby formed to overlap only lower portions of the sidewalls of the first and second contact pad portions 162 and 164 while it is not formed on upper portions of those sidewalls and while it is not formed on top surfaces of the first and second contact pad portions 162 and 164. As indicated, in one embodiment, the passivation film 171 formed in the surrounding area SA is made of the same material(s) and with the same single or multi-layered structuring as that of the passivation film 71 formed in the pixels-populated area PA. In addition, the passivation film 171 formed in the surrounding area SA may integrally extend from the passivation film 71 formed in the pixels-populated area PA.

After the passivation film 171 is formed to a less than t1 thickness (t1 being the thickness of pad portions 162 and 164) and patterned so as to extend only partially up the sidewalls of portions 162, 164; the insulating layer 181 is deposited in spaces between the first and second pad portions 162 and 164 and on the passivation film 171. Here, the insulating layer 181 may also be selectively formed on the passivation film 171 located on the sidewalls of the first and second pad portions 162 and 164. Accordingly, a portion of the passivation film 171 may be positioned between each of the first and second pad portions 162 and 164 and the insulating layer 181. Here, a first distance d1 between a top surface 173 of the passivation film 171 and the base substrate 10 may be smaller than a second distance d2 between a top surface 183 of the insulating layer 181 and the top of the base substrate 10. In addition, a groove 177 is formed, the groove 177 constituted by the portions of the sidewalls of the first and second pad portions 162 and 164, the top surface 173 of the passivation film 171 and the sidewall of the insulating layer 181.

Meanwhile, the insulating layer 181 may be formed to have a thickness t2 that is smaller than or equal to the thickness t1 of each of the first and second pad portions 162 and 164. That is to say, the insulating layer 181 may be formed (e.g., etched back) such that does not overlap the tops of the first and second pad portions 162 and 164. As mentioned, the material of the insulating layer 181 is chosen so that it preferentially adheres (bonds) to the material of the passivation film 171 but not to the material of the first and second pad portions 162, 164. Accordingly, if the insulating layer 181 is patterned so as to overlap the tops of the pad portions 162, 164; the poor bonding between these materials would allow for an easy peel-off or lifting phenomenon of the insulating layer 181 from the tops of the pad portions 162, 164. However, because the insulating layer section 181 of the surrounding area SA is patterned to not overlap the tops of the pad portions 162, 164; the undesired easy peel-off or lifting phenomenon of the insulating layer 181 may be eliminated. In one embodiment, a ratio of the thickness t1 of each of the first and second pad portions 162 and 164 to the thickness t2 of the insulating layer 181 may be in the range of t1/t2=about 1:1 to about 2:1. Here, if the t1/t2 ratio is substantially less than 1:1, it is difficult to eliminate the lifting phenomenon of the insulating layer 181 because the insulating layer 181 then tends to overlap and poorly bond to the tops of the first and second pad portions 162 and 164. Meanwhile, if the t1/t2 ratio is substantially greater than 2:1, a process time (e.g., etch back time) for adjusting the thickness t2 of the insulating layer 181 may be lengthened while not further eliminating the lifting phenomenon of the insulating layer 181. The thickness t1 of each of the first and second pad portions 162 and 164 may be in a range of, for example, 8000 Å to 10000 Å. The thickness t2 of the insulating layer 181 may be in a range of, for example, 5000 Å to 10000 Å.

The insulating layer 181 formed in the surrounding area SA may be made of the same material as the insulating layer 81 formed in the pixels-populated area PA. In addition, the insulating layer 181 formed in the surrounding area SA may integrally extend from the insulating layer 81 formed in the pixels-populated area PA.

The first conductive film 191 is formed on the top surfaces of the first and second pad portions 162 and 164 and on exposed upper portions of the sidewalls of the first and second pad portions 162 and 164. Here, the exposed portions of the sidewalls of the first and second pad portions 162 and 164 correspond to upper portions thereof. The first conductive film 191 may be formed to surround the top surfaces of the first and second pad portions 162 and 164 and portions of the sidewalls of the first and second pad portions 162 and 164. Meanwhile, a second conductive film 192 is formed on the insulating layer 181. Here, the first conductive film 191 and the second conductive film 192 may be discretely formed as spaced apart entities due to existence of the groove 177. That is to say, the first conductive film 191 and the second conductive film 192 are not shorted to each other, and the first conductive film 191 and the second conductive film 192 are instead electrically insulated from one another. Meanwhile, the first conductive film 191 and the second conductive film 192 may be made of the same material as that of the pixel electrode 92.

Figure 5:
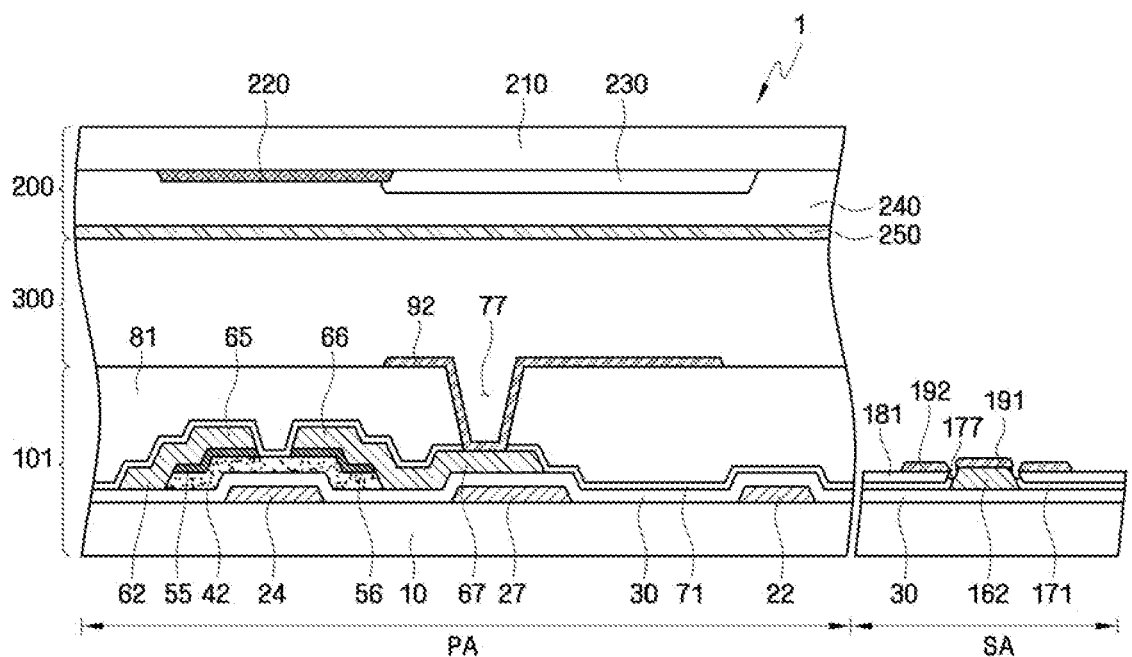
FIG. 5 is a sectional view of a display substrate according to a second embodiment.

Next, a display substrate according to a second embodiment will be described with reference to FIG. 5. FIG. 5 is a cross-sectional view of a display substrate according to a second embodiment of the present disclosure. For the sake of convenient explanation, the same functional members as those of the first embodiment are denoted by the same reference numeral and detailed explanations thereof will be omitted.

Referring to FIG. 5, the display device 1 according to the second embodiment may include the first display substrate 101 (as already described), a second display substrate 200 and a liquid crystal material layer 300 interposed therebetween. Here, since the first display substrate 101 is substantially the same as the display substrate 101 of the first embodiment, repetitive explanations thereof will be omitted.

The second display substrate 200 will now be described. A black matrix 220 for preventing leakage of light through regions thereof is formed on an insulating substrate 210. The black matrix 220 may be formed in an area other than an area facing the pixel electrode 92 to define a pixel area. The black matrix 220 may be made of a non-transparent organic material and/or of an opaque metal.

Color filters 230 for a color display are formed on the insulating substrate 210. To achieve the color display, the color filters 230 may include red, green and blue color filters. The color filters 230 may selectively absorb or transmit light of a specific wavelengths range through use of red, green and blue pigments contained therein, thereby displaying a red, green or blue color. Here, the color filters 230 may display a color by additive color mixture of red light, green light and blue light. Although not shown, a color filter may be formed on the first display substrate 101, instead of the second display substrate 200.

A planarizing overcoat layer 240 is formed on the black matrix 220 and the color filters 230 to reduce a step difference therebetween.

The overcoat 240 is made of a transparent organic material, and is formed for the purpose of protecting the color filters 230 and the black matrix 220 and insulating the color filters 230 and the black matrix 220 from a common electrode 250 to be described later.

The common electrode 250 is formed on the overcoat 240. Here, the common electrode 250 may be made of a transparent conductive material such as indium tin oxide (ITO) or indium zinc oxide (IZO).

The liquid crystal material layer 300 is interposed between the first display substrate 101 and the second display substrate 200. The transmissivity of light passed through each pixel area may be adjusted by a voltage difference provided between the corresponding pixel electrode 92 and the common electrode 250.

Figure 6:
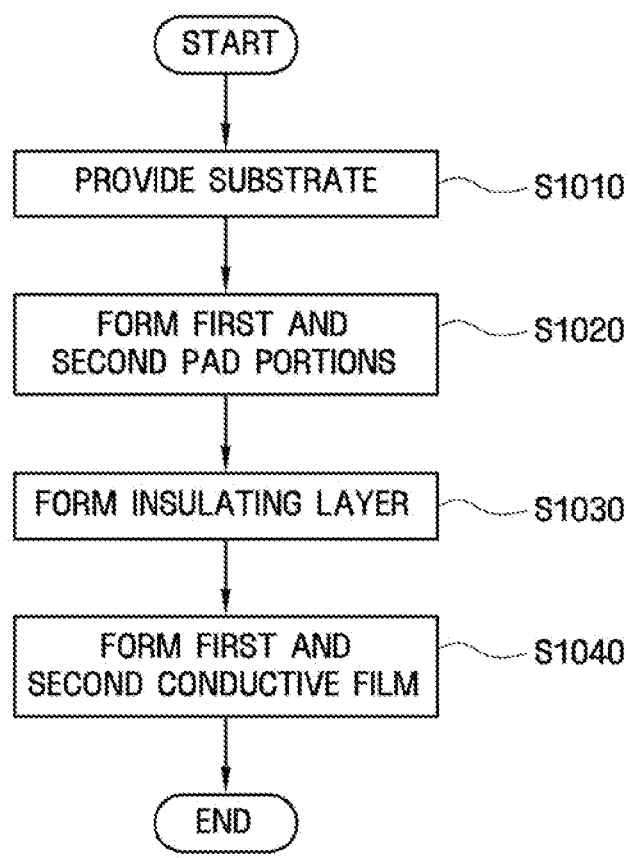
FIG. 6 is a flow chart illustrating a method of manufacturing a display device according to a third embodiment.
Figure 7A:
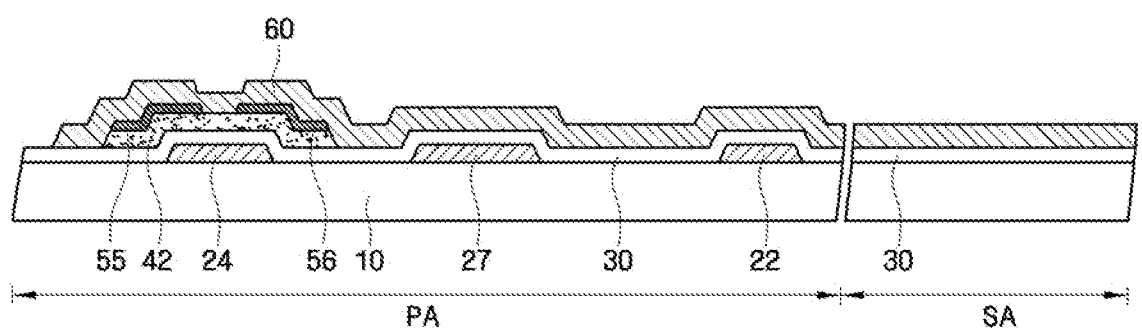
FIGS. 7A through 13 are sectional views illustrating process steps of the method of manufacturing a display device shown in FIG. 6.
Figure 7B:
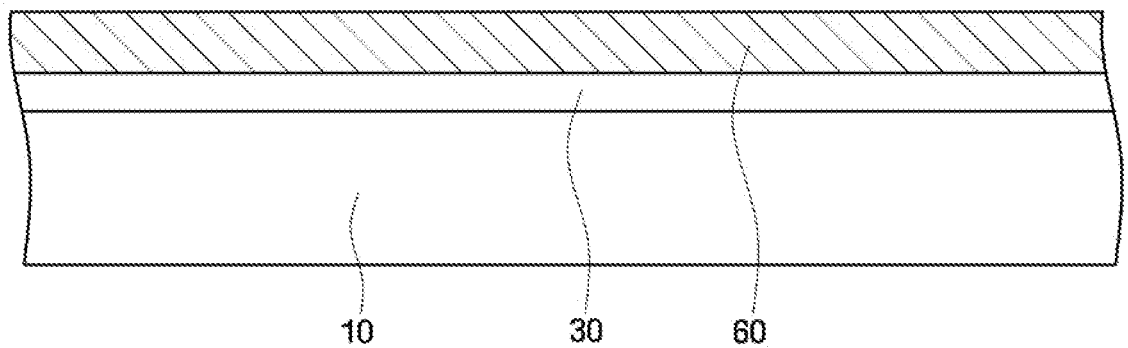

Next, a display substrate according to a third embodiment will be described with reference to FIGS. 2, 3, 4 and 6 through 13. For the sake of convenient explanation, the same functional members as those of the first embodiment are denoted by the same reference numeral and detailed explanations thereof will be omitted. FIG. 6 is a flow chart illustrating a method of manufacturing a display device according to a third embodiment. FIGS. 7A through 13 are sectional views illustrating process steps of the method of manufacturing a display device as flow charted in FIG. 6.

Referring first to FIGS. 2 and 6 through 7B, the base substrate 10 having the pixels-populated area PA and the surrounding area SA defined therein is provided (step S1010). A metal film (not shown) for the gate wirings is deposited on the pixels-populated area PA of the base substrate 10, and patterned, thereby forming the gate wirings (22, 24, 27, 28) including the gate line 22, the gate electrode 24, the storage electrode 27, and the storage line 28. Here, a sputtering process may be used to form the metal film for the gate layer wirings. The sputtering may be performed at a low temperature of, for example, 200° C. or less. The metal film for the gate wirings is formed by low-temperature sputtering, thereby preventing deterioration of the base substrate 10. Subsequently, the metal film for gate wiring is patterned using wet etching or dry etching, thereby forming the patterned gate wirings (22, 24, 27, 28). In a case where wet etching is used in patterning the metal film for gate wiring, an etching solution such as phosphoric acid, nitric acid, acetic acid, or the like.

Next, the gate insulating layer 30 is formed on the base substrate 10 and on the gate wirings (22, 26, 27, 28). The gate insulating layer 30 is formed by depositing a silicon nitride ($SiN_x$) or a silicon oxide ($SiO_x$) on the base substrate 10 and the gate wiring (22, 26, 27, 28) using, for example, plasma enhanced chemical vapor deposition (PECVD) or reactive sputtering.

Subsequently, amorphous silicon (a-Si) and amorphous silicon doped with n-type impurity in a high concentration are sequentially deposited using, for example, CVD, on the gate insulating layer 30, thereby forming the semiconductive layer 42 and the ohmic contact layers 55 and 56 on the pixels-populated area PA. In some cases, the ohmic contact layers 55 and 56 may be omitted.

Next, a conductive film 60 for forming the data wirings (62, 65, 66, 67) and the first and second pad portions 162 and 164 is deposited on the pixels-populated area PA and the surrounding area SA on the entire surface of the base substrate 10 using, for example, CVD.

Figure 8A:
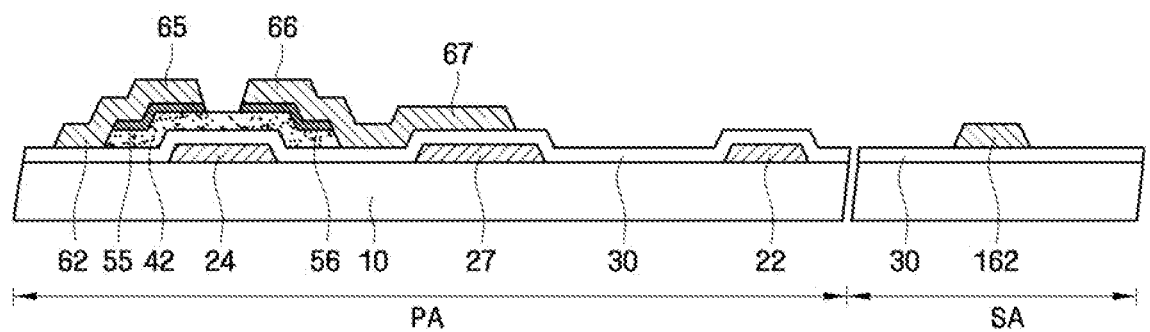
Figure 8B:
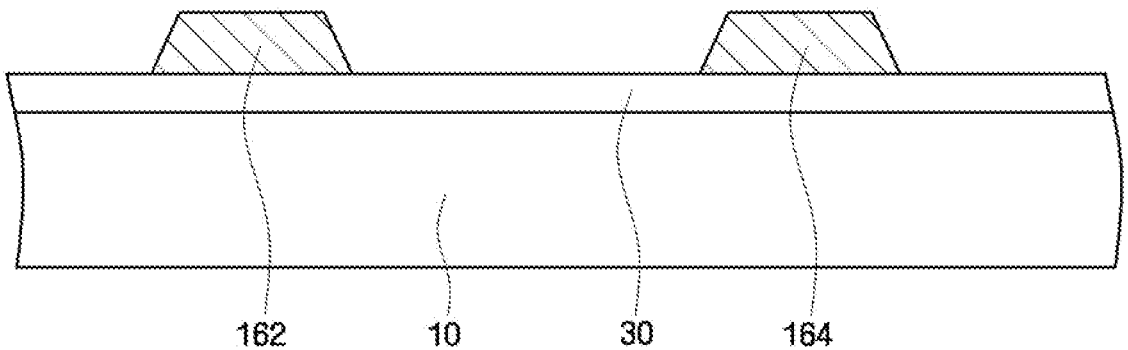

Next, referring to FIGS. 6, 8A and 8B, the conductive film 60 for forming the data wirings (62, 65, 66, 67) and the first and second pad portions 162 and 164 are patterned. The patterning of the conductive film 60 leads to formation of the data wiring (62, 65, 66, 67) in the pixels-populated area PA and formation of the neighboring first and second portions 162 and 164 as being spaced apart from one another in the surrounding area SA, respectively (step S1020). Here, the first contact pad portion 162 and the second contact pad portion 164 are spaced a predetermined distance apart from each other by a spacing region formed therebetween. Data line extensions extending substantially symmetrically from the first and second contact pad portion 162, 164 may be substantially parallel to each other.

Figure 9A:
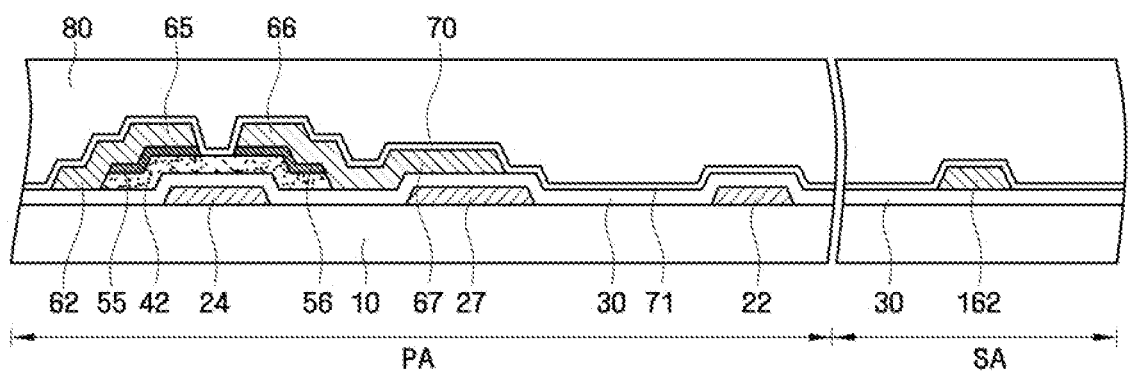
Figure 9B:
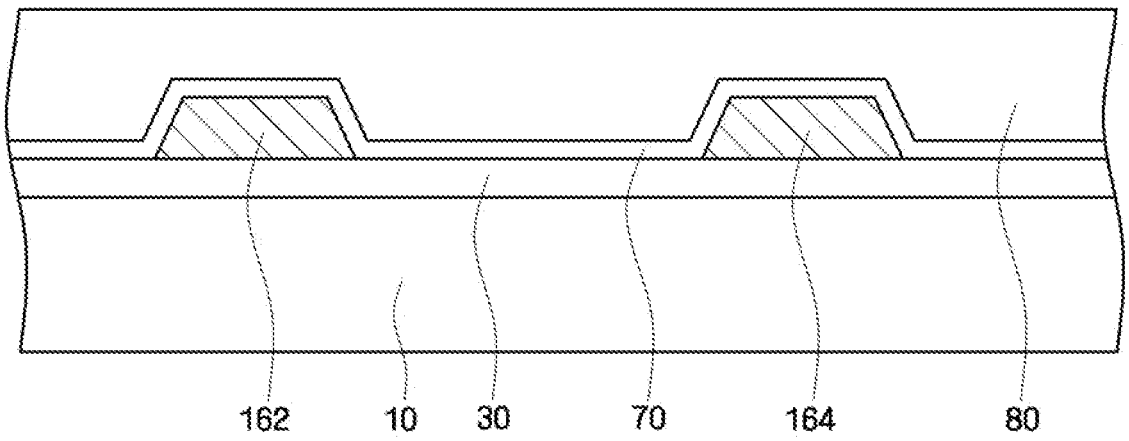

Next, referring to FIGS. 9A and 9B, a first passivation film 70 is formed on the resultant structure of FIGS. 8A and 8B. Here, the first passivation film 70 is formed to cover the first and second pad portions 162 and 164 and the data wiring (62, 65, 66, 67). The first passivation film 70 may be made of the same material as the gate insulating layer 30 using, for example, CVD.

Subsequently, a first insulating material film 80 is formed on the first passivation film 70 to cover the first and second pad portions 162 and 164 and the data wiring (62, 65, 66, 67). The first insulating material film 80 may be formed using, for example, CVD or rotary coating (e.g., spin coating). Here, the first insulating material film 80 may be formed using, but not limited to, negative-type photoresist or positive-type photoresist. The first passivation film 70 and the first insulating material film 80 may be made of materials having different etching selectivities.

Figure 10:
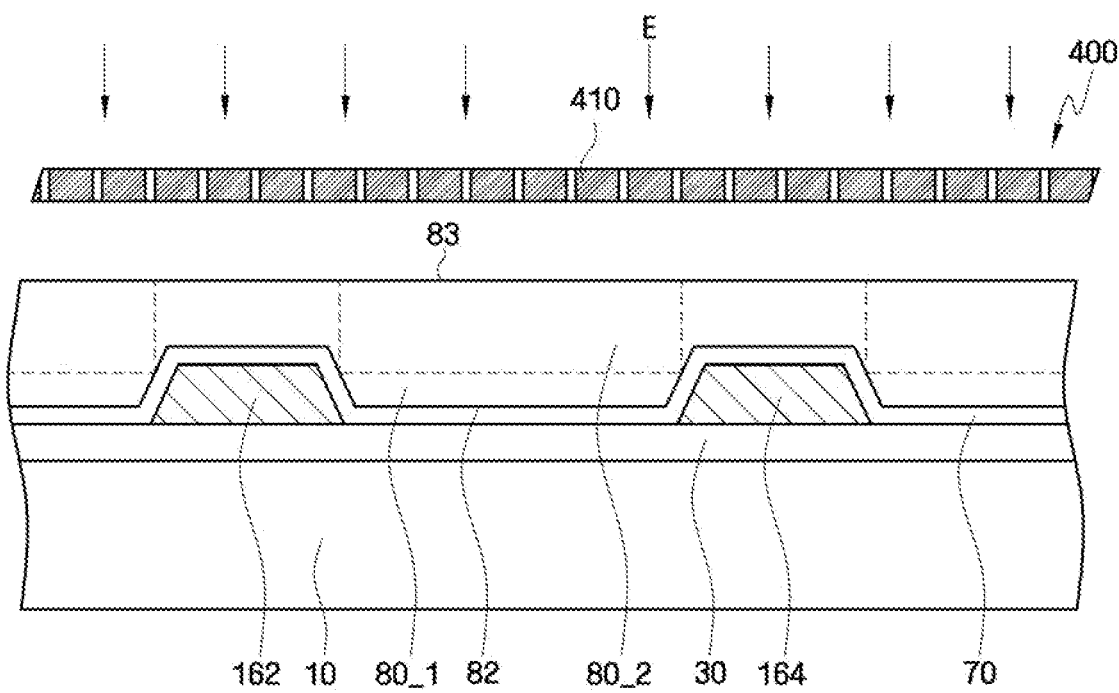

Next, referring to FIG. 10, the first insulating material film 80 (a.k.a. PR) is exposed to light. Meanwhile, after forming the first insulating material film 80 and before exposing the first insulating material film 80, in order to increase mechanical strength of the first insulating material film 80, the first insulating material film 80 may be prebaked.

In the exposing process, a mask 400 such as a slitted mask or a half tone mask may be used. The mask 400 may include light-transmitting areas 410 through which light is transmitted. Only the light passing through the light-transmitting areas 410 of the photomask 400 is irradiated on the first insulating material film 80. Accordingly, exposure energy of the light irradiated on the first insulating material film 80 can be adjusted. Here, the first insulating material film 80 may be exposed at a developing speed of 0.25 times the maximum developing speed of the first insulating material film 80. That is to say, assuming that the maximum developing speed refers to a developing speed after the first insulating material film 80 is exposed without using a mask (in a case where the first insulating material film 80 is made of 'positive-type photoresist) and irradiation of light on the first insulating material film 80 is then completely blocked (in a case where the first insulating material film 80 is made of 'negative-type photoresist), in the exposing process of the third embodiment, the developing speed of the first insulating material film 80 is not greater than 0.25 times the maximum developing speed thereof.

Here, in a case where the first insulating material film 80 is made of 'positive-type photoresist, exposure energy for exposing the first insulating material film 80 is about 50% to about 80% of the exposure energy when the first insulating material film 80 is exposed at the maximum developing speed. Conversely, in a case where the first insulating material film 80 is made of 'negative-type photoresist, the exposure energy of the first insulating material film 80 may be about 10% to about 30% of the exposure energy when the first insulating material film 80 is exposed to cause the maximum chemical change to the first insulating material film 80. As the result of the above-described exposing process, the first insulating material film 80 is divided into a region 80_2 to be removed and a region 80_1 that is to be left behind (preserved) after a subsequent developing process.

Meanwhile, before the exposing step, the developing speed of the first insulating material film 80 may be caused to increase gradually from a lower portion 82 of the first insulating material film 80 that is relatively close to the base substrate 10 to an upper portion 83 of the first insulating material film 80 by differentially prebaking the first insulating material film 80 (e.g., via irradiative baking). That is to say, during developing, the remaining amount of the first insulating material film 80 may tend to be greater at the lower portion 82 than at the upper portion 83 of PR layer 80.

Figure 11:
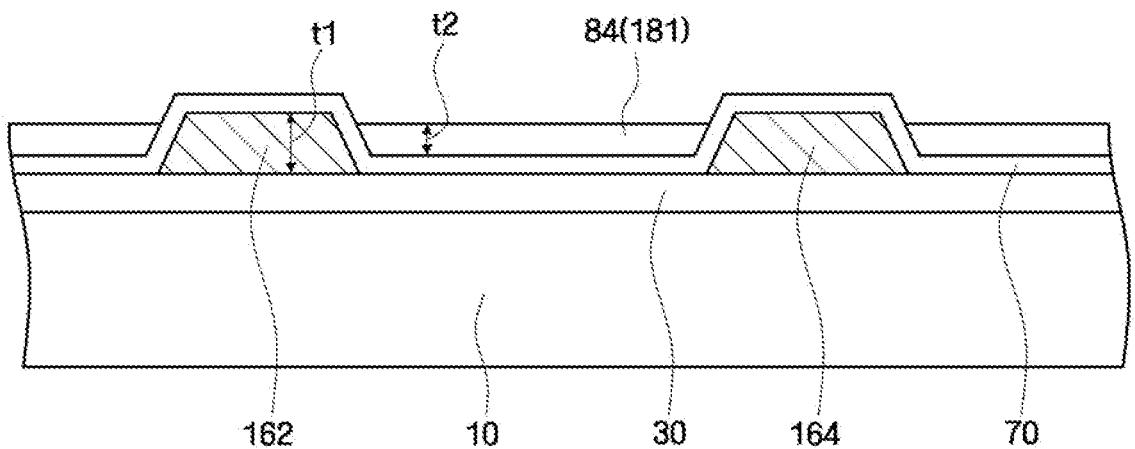

Next, referring to FIGS. 6 and 11, the exposed first insulating material film 80 is developed to form a patterned second insulating material film 84. A thickness t2 of the second insulating material film 84 may be smaller than or equal to a thickness t1 of each of the first and second pad portions 162 and 164. Thereafter, the second insulating material film 84 is cured to improve mechanical strength thereof, thus forming the insulating layer 181 (step S1030).

Figure 12:
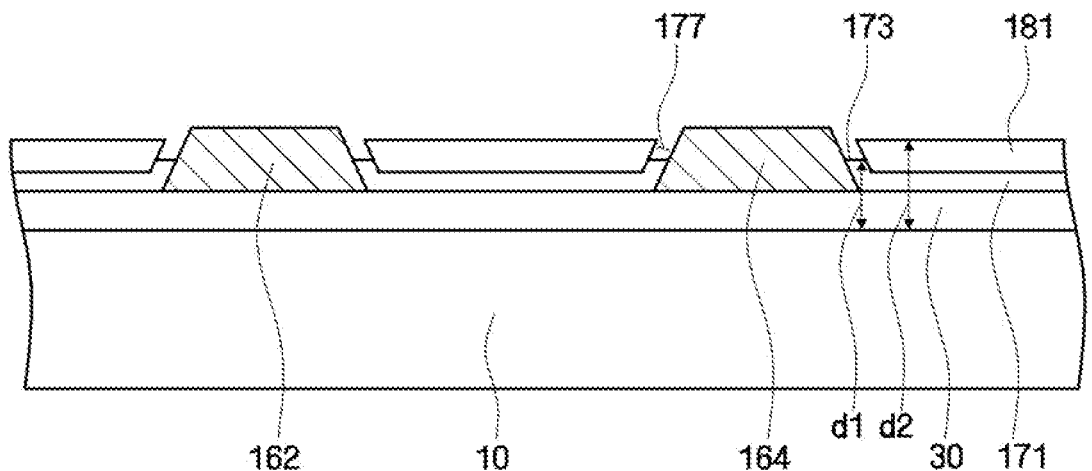

Referring next to FIG. 12, a portion of the first passivation film 70 formed on the first and second pad portions 162 and 164 is selectively removed to thereby form the second passivation film 171. That is to say, the first passivation film 70, formed on the top surfaces and portions of upper sidewalls of the first and second pad portions 162 and 164, is removed for example by anisotropic etching. As a result, the top surfaces and portions of upper sidewalls of the first and second pad portions 162 and 164 are exposed. Here, a first distance d1 between a top surface 173 of the post-etch second passivation film 171 and the base substrate 10 may be smaller than a second distance d2 between a top surface 183 of the insulating layer 181 and the base substrate 10. As a result, while the portion of the first passivation film 70 is removed, and a groove 177 may be formed, the groove 177 bounded by the upper portions of the sidewalls of the first and second pad portions 162 and 164, the top surface 173 of the passivation film 171 and the counter-inclined sidewall of the insulating layer 181.

Figure 13:
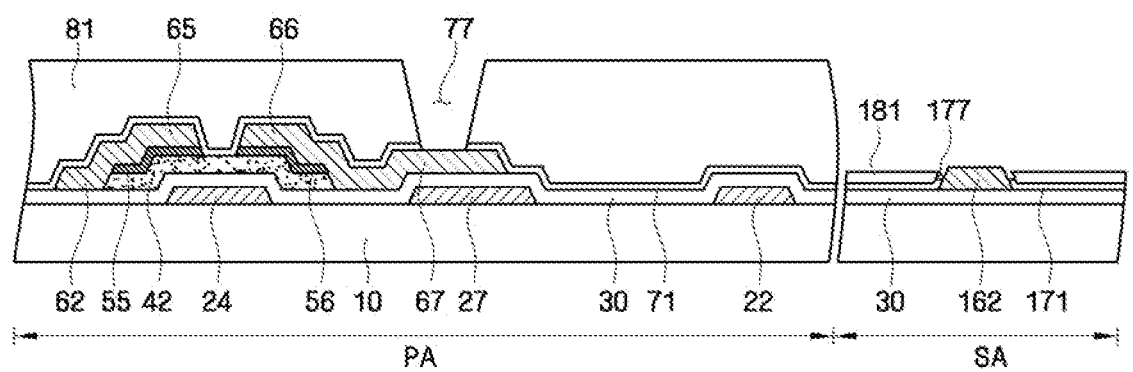

Referring to FIG. 13, a contact hole 77 exposing the drain electrode contact pad 67 of the TFT is formed through the second passivation film 71 and through the insulating layer 81 and is formed in the pixels-populated area PA.

Referring to FIGS. 3 and 6, the first conductive film 191 is formed on the first and second pad portions 162 and 164. The first conductive film 191 is formed by depositing ITO on the first and second pad portions 162 and 164 using, for example, sputtering. Here, a second conductive film 192 is also formed on the insulating layer 181, and the first conductive film 191 and the second conductive film 192 are formed in a discontinuous manner due to existence of the groove 177. In the pixels-populated area PA, a pixel electrode 92 is formed to contact the drain electrode pad 67 through the contact hole 77.

Figure 14:
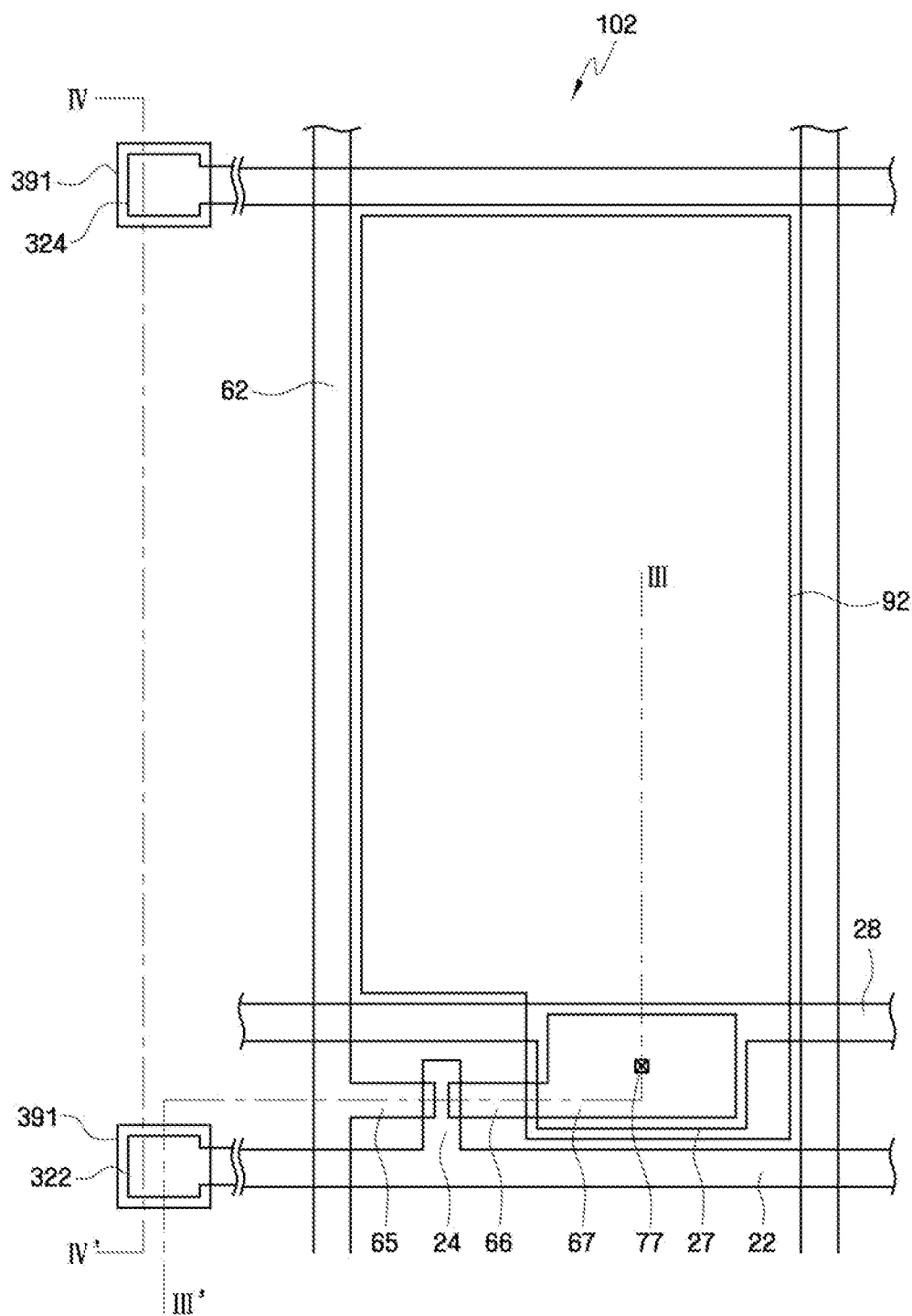
FIG. 14 is a plan view of a display substrate according to a fourth embodiment.
Figure 15:
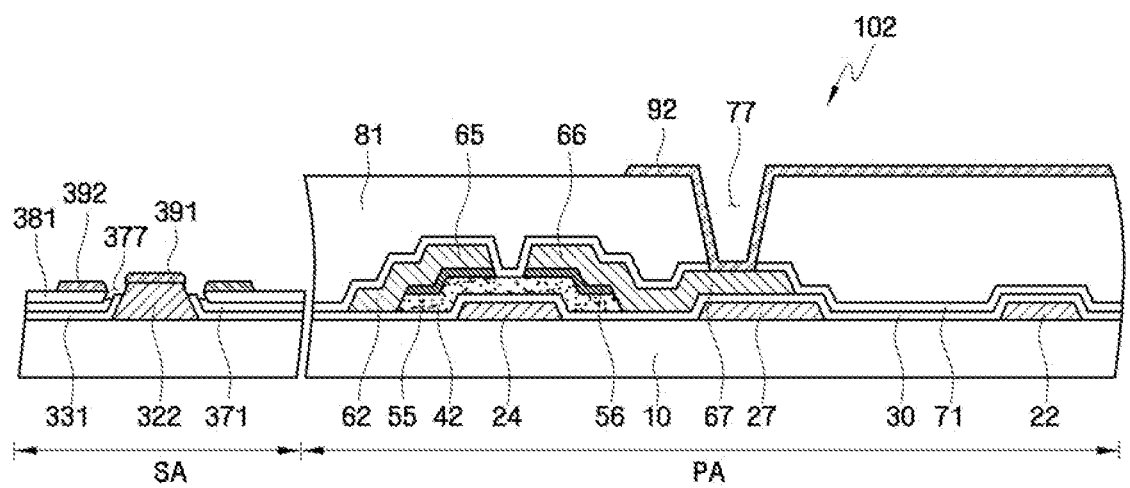
FIG. 15 is a sectional view, taken along line III-III' in FIG. 14.
Figure 16:
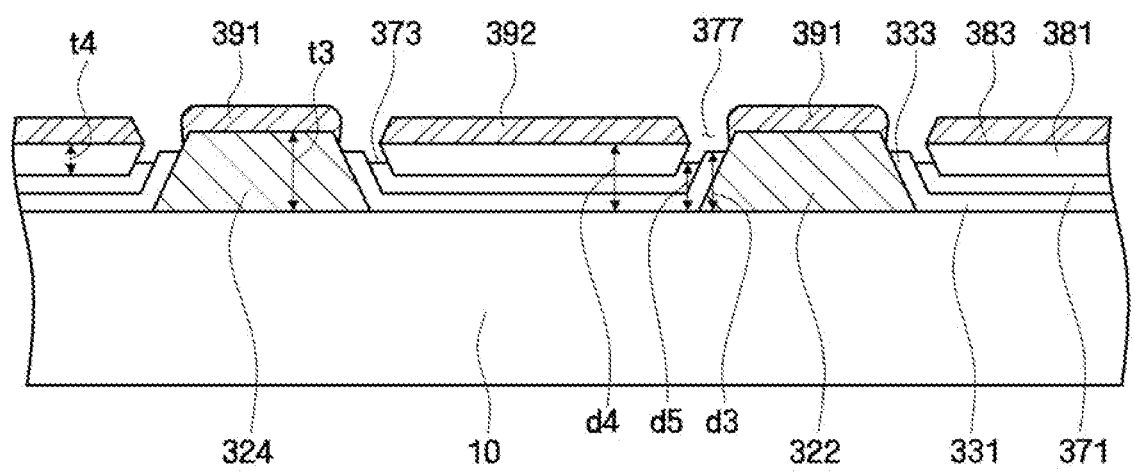
FIG. 16 is a sectional view, taken along line IV-IV' in FIG. 14.

Next, a display device according to a fourth embodiment will be described with reference to FIGS. 1 and 14 through 16. FIG. 14 is a plan view of a display substrate according to the fourth embodiment, FIG. 15 is a sectional view, taken along line III-III' in FIG. 14, and FIG. 16 is a sectional view, taken along line IV-IV' in FIG. 14. For the sake of convenient explanation, the same functional members as those of the first embodiment are denoted by the same reference numeral and detailed explanations thereof will be omitted.

Referring to FIGS. 1 and 14 through 16, the display substrate 102 according to the fourth embodiment includes a TFT formed in the pixels-populated area PA of the base substrate 10, and the first and second gate line contact pad portions 322 and 324 formed in the surrounding area SA. For brevity of explanation, the gate insulating layer formed in the pixels-populated area PA is denoted by reference numeral 30, the gate insulating layer formed in the surrounding area SA is denoted by reference numeral 331. In addition, the passivation film formed in the pixels-populated area PA is denoted by reference numeral 71, and the passivation film formed in the surrounding area SA is denoted by reference numeral 371. Further, the insulating layer formed in the pixels-populated area PA is denoted by reference numeral 81, and the insulating layer formed in the surrounding area SA is denoted by reference numeral 381.

Meanwhile, since the TFT formed in the pixels-populated area PA is substantially the same as the TFT of the first embodiment, repetitive explanations will be omitted.

Pad portions formed in the surrounding area SA will now be described.

A third pad portion 322 and a fourth pad portion 324 adjacent to the third pad portion 322 are formed on the base substrate 10. The third and fourth pad portions 322 and 324 may be made of the same material as the gate wirings (22, 24). A gate line 22 may integrally extend from the third and fourth gate line contact pad portions 322 and 324. That is to say, the third and fourth pad portions 322 and 324 may be electrically connected to the gate line 22. Accordingly, when respective external electrical signals (e.g., gate signals) are applied to the third and fourth pad portions 322 and 324, the external electrical signal may be transmitted to the corresponding gate electrodes 24 of the respective pixel units through the gate lines 22, 22' electrically connected to the third and fourth pad portions 322 and 324.

A gate insulating layer 331 is formed on portions of sidewalls of the third and fourth pad portions 322 and 324 and on the base substrate 10. The gate insulating layer 331 is formed on the sidewalls of the third and fourth pad portions 322 and 324, the sidewalls being adjacent to the base substrate 10. That is to say, the gate insulating layer 331 is formed on lower portions of the sidewalls of the third and fourth pad portions 322 and 324 while it is not formed on upper portions of the sidewalls of the third and fourth pad portions 322 and 324 and top surfaces of the third and fourth pad portions 322 and 324. The gate insulating layer 331 formed in the surrounding area SA may be made of the same material as the gate insulating layer 30 formed in the pixels-populated area PA. Here, the gate insulating layer 331 formed in the surrounding area SA may integrally extend from the gate insulating layer 30 formed in the pixels-populated area PA.

A passivation film 371 is formed on the gate insulating layer 331. A portion of the passivation film 371 is formed on portions of the sidewalls of the third and fourth pad portions 322 and 324. Here, the portion of the gate insulating layer 331 may be positioned between the sidewalls of the third and fourth pad portions 322 and 324 and the portion of the passivation film 371. Meanwhile, the passivation film 371 is formed on the sidewalls of the third and fourth pad portions 322 and 324, the sidewalls being adjacent to the base substrate 10. That is to say, the passivation film 371 is formed on lower portions of the sidewalls of the third and fourth pad portions 322 and 324 while it is not formed on upper portions of the sidewalls and top surfaces of the third and fourth pad portions 322 and 324. Meanwhile, the passivation film 371 formed in the surrounding area SA may be made of the same material as the passivation film 71 formed in the pixels-populated area PA. In addition, the passivation film 371 formed in the surrounding area SA may integrally extend from the passivation film 71 formed in the pixels-populated area PA.

An insulating layer 381 is formed between each of the third and fourth pad portions 322 and 324 and the passivation film 371. The insulating layer 381 may also be formed on the passivation film 371 positioned on the sidewalls of the third and fourth pad portions 322 and 324. Accordingly, a portion of the passivation film 371 may be positioned between each of the third and fourth pad portions 322 and 324 and the insulating layer 381. In addition, a portion of the gate insulating layer 331 may also be positioned between each of the third and fourth pad portions 322 and 324 and the insulating layer 381.

A distance d5 between a top surface 373 of the passivation film 371 and the base substrate 10 may be smaller than a distance d4 between a top surface 383 of the insulating layer 381 and the base substrate 10. In addition, a distance d3 between a top surface 333 of the gate insulating layer 331 and the base substrate 10 may be smaller than the distance d4 between the top surface 383 of the insulating layer 381 and the base substrate 10. Accordingly, top surfaces and upper sidewalls of the third and fourth pad portions 322 and 324 may be exposed.

Meanwhile, a groove 377 may be formed, the groove 377 bounded by the portions of the sidewalls of the third and fourth pad portions 322 and 324, the top surface 373 of the passivation film 371 and the sidewall of the insulating layer 381.

The insulating layer 381 may be formed to have a thickness t4 that is smaller than or equal to a thickness of t3 of each of the third and fourth pad portions 322 and 324. That is to say, the insulating layer 381 may be formed such that it is not positioned on the third and fourth pad portions 322 and 324. Accordingly, a lifting phenomenon of the insulating layer 381, which may be caused when the insulating layer 381 is positioned on the third and fourth pad portions 322 and 324 may be eliminated. Here, a ratio of the thickness t3 of each of the third and fourth pad portions 322 and 324 to the thickness t4 of the insulating layer 381 may be 1 to 2. Here, if the ratio is less than 1, it is difficult to eliminate the lifting phenomenon of the insulating layer 381 because the insulating layer 381 is positioned on the third and fourth pad portions 322 and 324. Meanwhile, if the ratio is greater than 2, a process time for adjusting the thickness t4 of the insulating layer 381 may be lengthened while sufficiently eliminating the lifting phenomenon of the insulating layer 381. The thickness t3 of each of the third and fourth pad portions 322 and 324 may be in a range of, for example, 8000 Å to 10000 Å. The thickness t3 of the insulating layer 381 may be in a range of, for example, 5000 Å to 10000 Å.

The insulating layer 381 formed on the surrounding area SA may be made of the same material as the insulating layer 81 formed on the pixels-populated area PA. In addition, the insulating layer 381 formed on the surrounding area SA may extend from the insulating layer 81 formed on the pixels-populated area PA.

A first conductive film 391 is formed on the top surfaces of the third and fourth pad portions 322 and 324 and portions of the sidewalls of the third and fourth pad portions 322 and 324. Here, the portions of the sidewalls of the third and fourth pad portions 322 and 324 correspond to upper portions thereof. The first conductive film 391 may be formed to surround the top surfaces and portions of the sidewalls of the third and fourth pad portions 322 and 324. Meanwhile, a second conductive film 392 is formed on the insulating layer 381. Here, the first conductive film 391 and the second conductive film 392 may be discretely formed due to existence of the groove 377. That is to say, the first conductive film 391 and the second conductive film 392 are not shorted to each other, and the first conductive film 391 and the second conductive film 392 are electrically insulated from one another. Meanwhile, the first conductive film 391 and the second conductive film 392 may be made of the same material as the pixel electrode 92.

Figure 17:
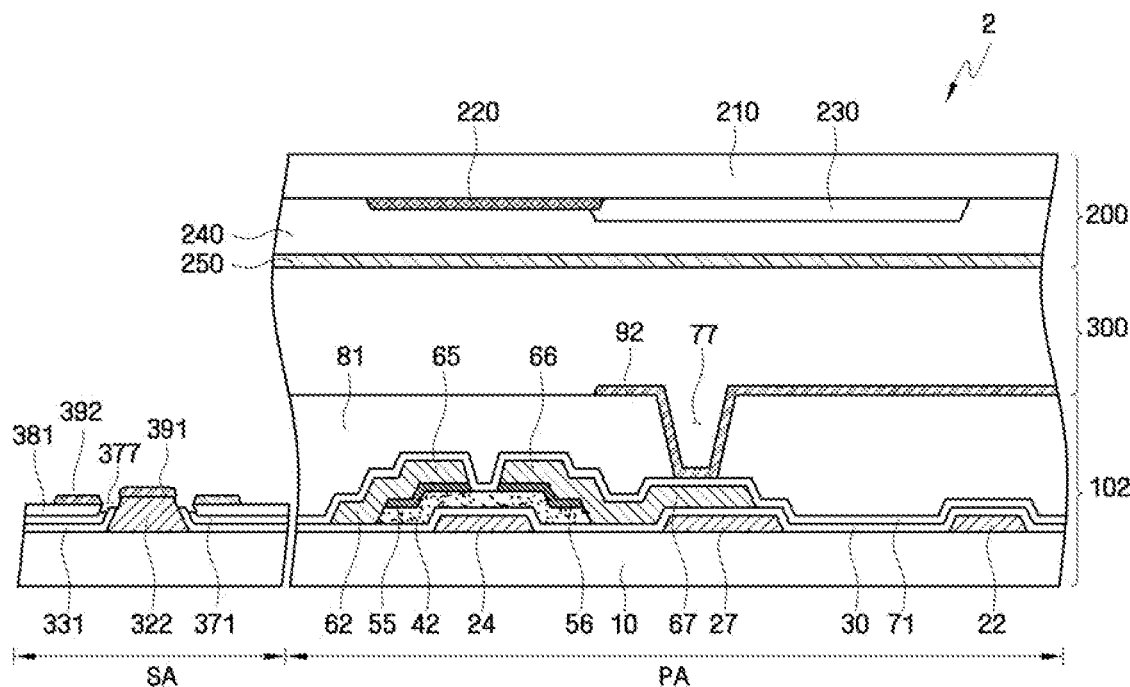
FIG. 17 is a sectional view of a display substrate according to a fifth embodiment.
Figure 18A:
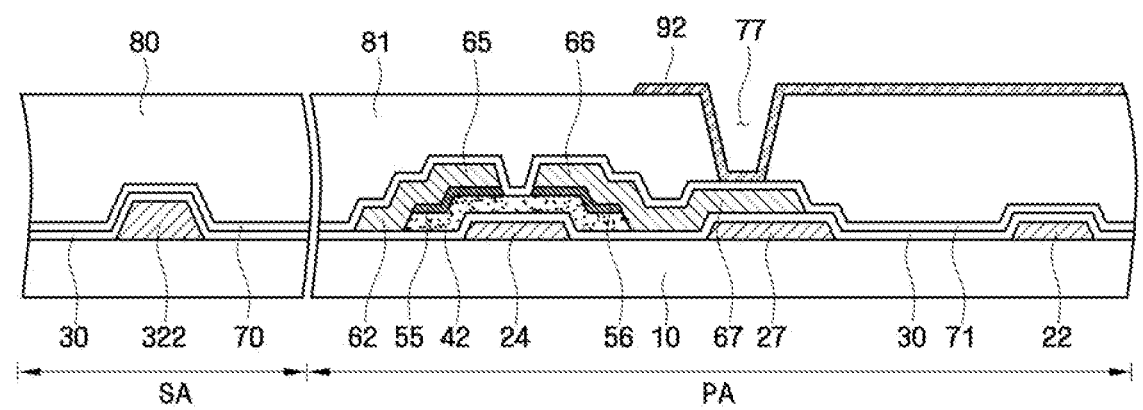
FIGS. 18A through 22 are sectional views illustrating process steps of a method of manufacturing a display device according to a sixth embodiment.
Figure 18B:
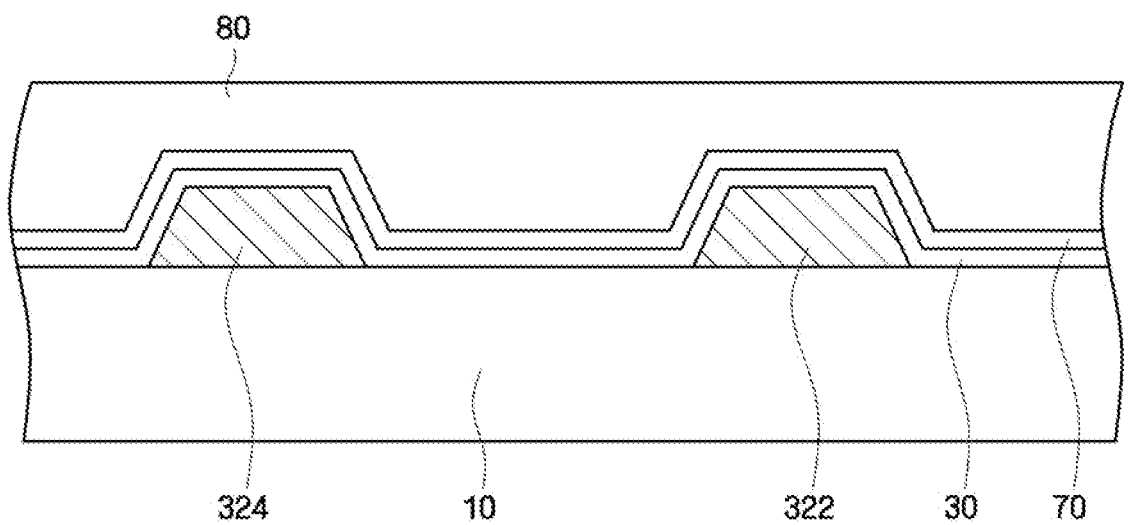

Next, a display substrate according to a fourth embodiment will be described with reference to FIG. 17. FIG. 17 is a sectional view of a display substrate according to a fifth embodiment of the present invention. For the sake of convenient explanation, the same functional members as those of the first embodiment are denoted by the same reference numeral and detailed explanations thereof will be omitted or abbreviated.

Referring to FIG. 17, the display substrate 2 according to the fifth embodiment of the present disclosure may include a first display substrate 102, a second display substrate 200 and a liquid crystal layer 300. Here, since the first display substrate 102 is substantially the same as the display substrate 102 of the fourth embodiment, repetitive explanations will be omitted. In addition, since the display substrate 2 according to the fifth embodiment is substantially the same as that of the second embodiment, except for a first display substrate 101, repetitive explanations will be omitted.

Next, a method of manufacturing a display device according to a sixth embodiment of the present disclosure will be described with reference to FIG. 6, FIGS. 14 through 16 and FIGS. 18A through 22. For the sake of convenient explanation, the same functional members as those of the fourth embodiment are denoted by the same reference numeral and detailed explanations thereof will be omitted or abbreviated. FIGS. 18A through 22 are sectional views illustrating process steps of a method of manufacturing a display device according to a sixth embodiment of the present invention.

First, referring to FIGS. 6, 14 and 18A and 18B, the base substrate 10 having the pixels-populated area PA and the surrounding area SA defined therein is provided (step S1010). A metal film (not shown) for gate wiring is deposited on the pixels-populated area PA of the base substrate 10, and patterned, thereby forming the gate wirings (22, 24, 27, 28) including the gate line 22, the gate electrode 24, the storage electrode 27, and the storage line 28. During formation of the gate wiring (22, 26, 27, 28), the third and fourth pad portions 322 and 324 are formed in the surrounding area SA (S1020). Here, the third pad portion 322 and the fourth pad portion 324 are formed to be spaced a predetermined distance apart from and adjacent to each other.

Meanwhile, a sputtering process may be used to form the metal film for gate wiring. The sputtering may be performed at a low temperature of, for example, 200° C. or less. The metal film for gate wiring is formed by low-temperature sputtering, thereby preventing deterioration of the base substrate 10. Subsequently, the metal film for gate wiring is patterned using wet etching or dry etching, thereby forming the gate wiring (22, 24, 27, 28) and the third and fourth pad portions 322 and 324. In a case where wet etching is used in patterning the metal film for gate wiring, an etching solution such as phosphoric acid, nitric acid, acetic acid, or the like.

Next, the gate insulating layer 30 is formed on the base substrate 10, the gate wiring (22, 26, 27, 28) and the third and fourth pad portions 322 and 324. The gate insulating layer 30 is formed by depositing a silicon nitride ($SiN_x$) or a silicon oxide ($SiO_x$) on the base substrate 10, the gate wiring (22, 26, 27, 28) and the third and fourth pad portions 322 and 324 using, for example, plasma enhanced chemical vapor deposition (PECVD) or reactive sputtering.

Subsequently, amorphous silicon (a-Si) and amorphous silicon doped with n-type impurity in a high concentration are sequentially deposited using, for example, CVD, on the gate insulating layer 30, thereby forming the semiconductive layer 42 and the ohmic contact layers 55 and 56 on the pixels-populated area PA. In some cases, the ohmic contact layers 55 and 56 may not be formed.

Next, the conductive film 60 for forming the data wiring (62, 65, 66, 67) and the first and second pad portions 162 and 164 are deposited formed on the entire surface of the base substrate 10, and a conductive film for forming the first and second pad portions 162 and 164 is deposited on the pixels-populated area PA and the surrounding area SA using, for example, CVD.

Next, the conductive film (60) for forming the data wiring (62, 65, 66, 67) is formed and patterned to form the data wiring (62, 65, 66, 67).

Then, the first passivation film 70 is formed. Here, the first passivation film 70 is formed to cover the data wiring (62, 65, 66, 67). The first passivation film 70 may be made of the same material as the gate insulating layer 30 using, for example, CVD.

Subsequently, the first insulating material film 80 is formed on the first passivation film 70. The first insulating material film 80 may be formed using, for example, CVD or rotary coating. Here, the first insulating material film 80 may be formed using, but not limited to, negative-type photoresist or positive-type photoresist. The first passivation film 70 and the first insulating material film 80 may be made of materials having different etching selectivities.

Figure 19:
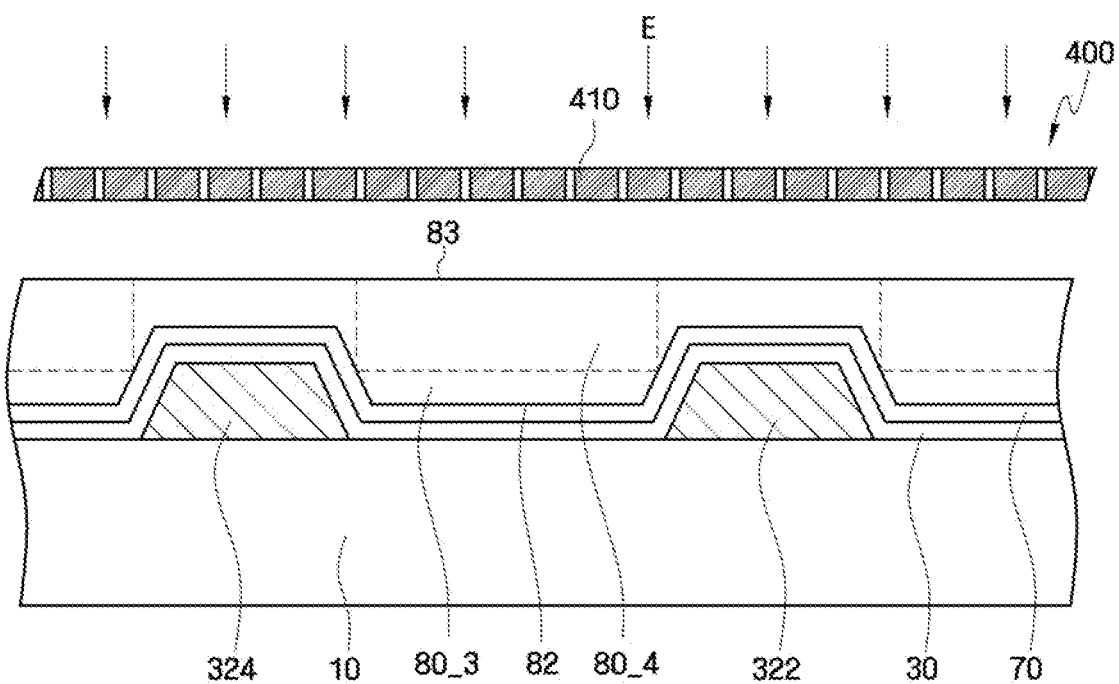

Referring to FIG. 19, the first insulating material film 80 is exposed to light. Meanwhile, after forming the first insulating material film 80 and before exposing the first insulating material film 80, in order to increase mechanical strength of the first insulating material film 80, the first insulating material film 80 may be prebaked.

In the exposing process, a mask 400 such as a slit mask or a half tone mask may be used. The mask 400 may include a light-transmitting area 410 through which light is transmitted. Only the light passing through the light-transmitting area 410 of the mask 400 is irradiated on the first insulating material film 80. Accordingly, exposure energy of the light irradiated on the first insulating material film 80 can be adjusted. Here, the first insulating material film 80 may be exposed at a developing speed of 0.25 times the maximum developing speed of the first insulating material film 80. That is to say, assuming that the maximum developing speed refers to a developing speed after the first insulating material film 80 is exposed without using a mask (in a case where the first insulating material film 80 is made of 'positive-type photoresist) and irradiation of light on the first insulating material film 80 is then completely blocked (in a case where the first insulating material film 80 is made of 'negative-type photoresist), in the exposing process of the sixth embodiment, the developing speed of the first insulating material film 80 is not greater than 0.25 times the maximum developing speed thereof.

Here, in a case where the first insulating material film 80 is made of 'positive-type photoresist, exposure energy for exposing the first insulating material film 80 is about 50% to about 80% of the exposure energy when the first insulating material film 80 is exposed at the maximum developing speed. Conversely, in a case where the first insulating material film 80 is made of 'negative-type photoresist, the exposure energy of the first insulating material film 80 may be about 10% to about 30% of the exposure energy when the first insulating material film 80 is exposed to cause the maximum chemical change to the first insulating material film 80. As the result of the above-described exposing process, the first insulating material film 80 is divided into a region 80_4 to be removed and a region 80_3 to be left after a subsequent developing process.

Meanwhile, before the exposing, the developing speed of the first insulating material film 80 increases gradually from a lower portion 82 of the first insulating material film 80 that is relatively close to the base substrate 10 to an upper portion 83 of the first insulating material film 80 by prebaking the first insulating material film 80. That is to say, during developing, the remaining amount of the first insulating material film 80 may be greater at the lower portion 82 than at the upper portion 83.

Next, referring to FIGS. 6 and 11, the exposed first insulating material film 80 is developed to form a second insulating material film 84. A thickness t2 of the second insulating material film 84 may be smaller than or equal to a thickness t1 of each of the first and second pad portions 162 and 164. Thereafter, the second insulating material film 84 is cured to improve mechanical strength thereof, forming the insulating layer 181 (S1030).

Figure 20:
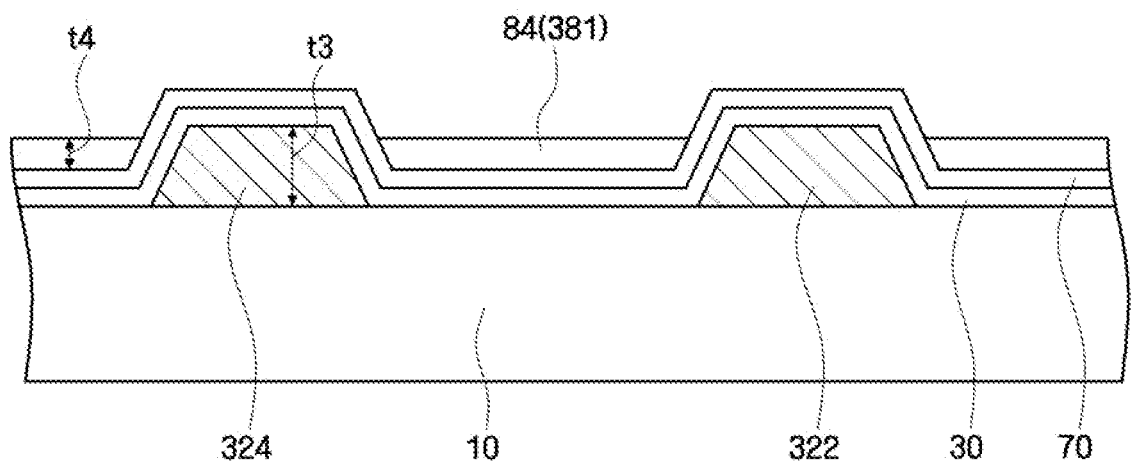

Consecutively, referring to FIGS. 6 and 20, the exposed first insulating material film 80 is developed to form the second insulating material film 84. Here, a thickness t4 of the second insulating material film 84 may be smaller than or equal to a thickness t3 of each of the third and fourth pad portions 322 and 324. Next, the second insulating material film 84 is cured to improve mechanical strength to form the insulating layer 381 (S1030).

Figure 21:
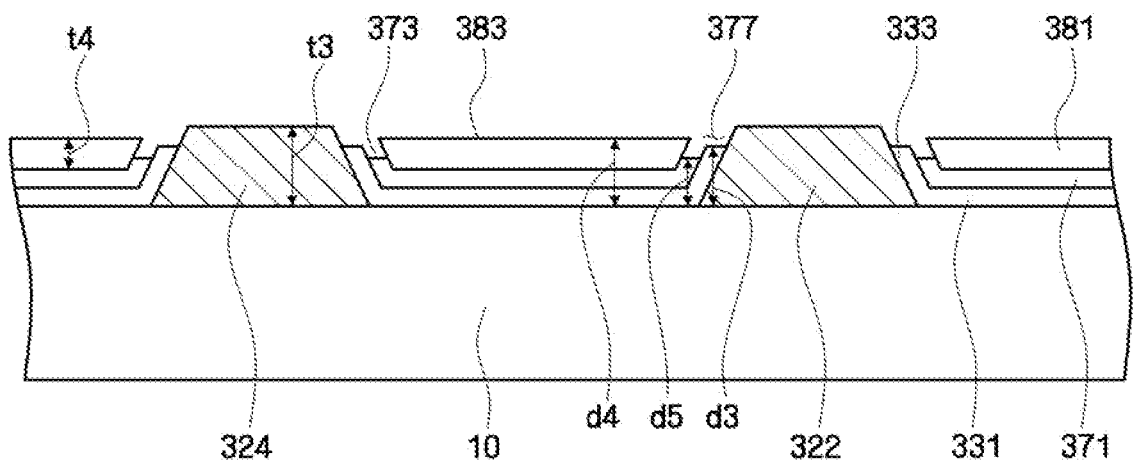

Next, referring to FIG. 21, a portion of the first passivation film 70 formed on the third and fourth pad portions 322 and 324 is removed to form the second passivation film 371. Then, a portion of the gate insulating layer 30 formed on the third and fourth pad portions 322 and 324 is removed to form the gate insulating layer 331 in the surrounding area SA.

That is to say, the first passivation film 70 formed on the top surfaces and portions of upper sidewalls of the third and fourth pad portions 322 and 324 is removed. In addition, the gate insulating layer 30 formed on the top surfaces and portions of upper sidewalls of the third and fourth pad portions 322 and 324 is also removed. Accordingly, the top surfaces and portions of upper sidewalls of the third and fourth pad portions 322 and 324 are partially exposed. Here, a distance d5 between the top surface 373 of the passivation film 371 and the base substrate 10 may be smaller than a distance d4 between the top surface 383 of the insulating layer 381 and the base substrate 10. In addition, a distance d3 between the top surface 333 of the gate insulating layer 331 and the base substrate 10 may be smaller than the distance d4 between the top surface 383 of the insulating layer 381 and the base substrate 10.

Meanwhile, while the portions of the first passivation film 70 and the gate insulating layer 30 are removed, a groove 377 may be formed, the groove 377 constituted by the portions of the sidewalls of the third and fourth pad portions 322 and 324, the top surface 373 of the passivation film 371, the top surface 333 of the gate insulating layer 331, and the sidewall of the insulating layer 381.

Figure 22:
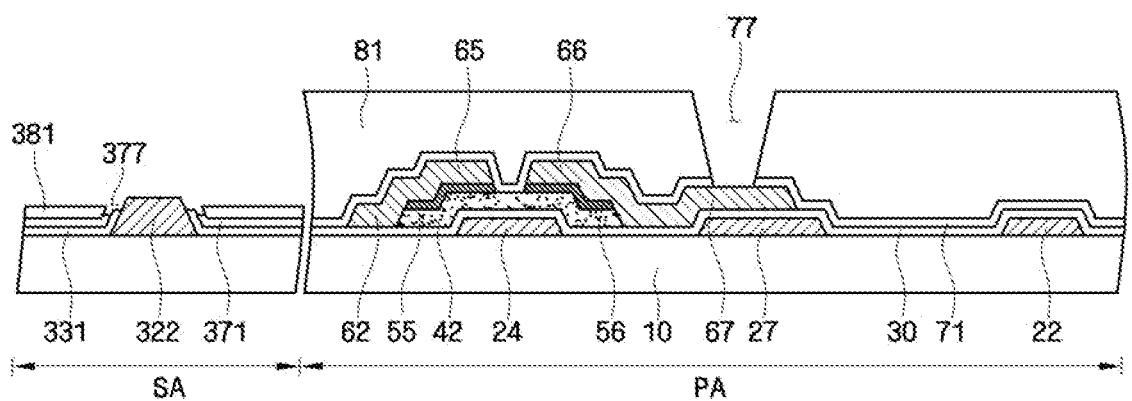

Next, referring to FIG. 22, a drain contact hole 77 exposing the drain electrode pad 67 of a TFT is formed through the second passivation film 71 and through the insulating layer 81 formed in the pixels-populated area PA.

Referring to FIGS. 6 and 15, the first conductive film 391 is formed on the third and fourth pad portions 322 and 324. The first conductive film 391 is formed by depositing ITO on the third and fourth pad portions 322 and 324 using, for example, sputtering. Here, the second conductive film 392 is also formed on the insulating layer 381, and the first conductive film 391 and the second conductive film 392 are formed in a discontinuous manner due to existence of the groove 377.

In the pixels-populated area PA, a pixel electrode 92 is formed to contact the drain electrode pad 67 through the contact hole 77.

While the present teachings have been particularly illustrated and described with reference to exemplary embodiments, it will be understood in light of the present disclosure and by those of ordinary skill in the art that various changes in form and details may be made therein without departing from the spirit and scope of the present teachings. It is therefore desired that the here disclosed embodiments be considered in all respects as illustrative and not restrictive.

What is claimed is:

1. A display device comprising:
a first substrate having a pixels-populated area (PA) that is populated by a plurality of pixel units configured to display an image and having a non-displaying, surrounding area (SA) outside the pixels-populated area;
a first contact pad portion formed in the surrounding area;
a second contact pad portion formed in the surrounding area neighboring the first contact pad portion but spaced apart therefrom by a spacing region, each of the first and second contact pad portions having a first thickness;
an insulating layer formed in the spacing region between the first and second contact pad portions, the insulating layer having a respective second thickness that is smaller than or equal to the first thickness of each of the first and second contact pad portions; and
respective first and second conductive film portions formed respectively on the first and second contact pad portions but not continuously extending into the spacing region between the first and second contact pad portions.

2. The display substrate of claim 1, wherein a ratio of the respective thicknesses of each of the first and second contact pad portions to the thickness of the insulating layer is in a range of about 1:1 to about 2:1.

3. The display substrate of claim 1, further comprising a passivation film formed in the spacing region between the first and second contact pad portions and under the insulating layer, the passivation film extending at least partially up along corresponding sidewalls of the first and second contact pad portions.

4. The display substrate of claim 3, wherein a distance between a top portion of the passivation film and the base substrate is smaller than a distance between a top portion of the insulating layer and the base substrate.

5. The display substrate of claim 3, further comprising a third conductive film portion formed on the insulating layer, wherein the first, second and third conductive film portions are not continuous with one another and are thus not electrically shorted to one another.

6. The display substrate of claim 5, wherein the first and second conductive film portions are respectively positioned on respective top surfaces as well as extending at least partially down along upper portions of the respective sidewalls of the first and second contact pad portions so that risk is thereby reduced of peel-off of the first and second conductive film portions from their respective first and second contact pad portions.

7. The display substrate of claim 1, further comprising a gate insulating layer formed in the spacing region between the first and second contact pad portions and under the insulating layer, the gate insulating layer extending at least partially up along corresponding sidewalls of the first and second contact pad portions, the gate insulating layer also providing gate insulation for insulated gate transistors in the pixels-populated area (PA) of the display.

8. The display substrate of claim 7, wherein a distance between a top surface of the gate insulating layer and the base substrate is smaller than a distance between a top surface of the insulating layer and the base substrate.

9. The display substrate of claim 7, further comprising a passivation film interposed between the gate insulating layer and the insulating layer.

10. The display substrate of claim 9, wherein a portion of the passivation film overlaps a corresponding portion of the gate insulating layer that extends at least partially up along a corresponding sidewall of one of the first and second pad portions.

11. The display substrate of claim 10, wherein a distance between a top surface of the passivation film and the base substrate is smaller than a distance between a top surface of the insulating layer and the base substrate.

12. The display substrate of claim 9, further comprising a third conductive film portion formed on the insulating layer, wherein the first, second and third conductive film portions are spaced apart from each other and thus not electrically shorted one to the other.

13. The display substrate of claim 12, wherein the first and second conductive film portions are respectively positioned on top surfaces of the respective first and second contact pad portions and the first and second conductive film portions further respectively extend down along corresponding sidewalls of their respective first and second contact pad portions.

* * * * *